(12) United States Patent
Shi (10) Patent No.: US 9,077,259 B2
(45) Date of Patent: Jul. 7, 2015

(54) GATE DRIVER CIRCUIT AND METHOD (75) Inventor: Justin Shi, Ann Arbor, MI (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/603,480

(22) Filed: Sep. 5, 2012

(65) Prior Publication Data

US 2014/0062542 A1 Mar. 6, 2014

(51) Int. Cl.
| | |
|---|---|
| H03K 3/00 | (2006.01) |
| H03K 7/08 | (2006.01) |
| H02M 1/38 | (2007.01) |
| H03K 17/12 | (2006.01) |
| H03K 17/284 | (2006.01) |
| H02M 3/155 | (2006.01) |
| H02M 1/08 | (2006.01) |

(52) U.S. Cl.
CPC .............. *H02M 1/38* (2013.01); *H03K 17/122* (2013.01); *H03K 17/284* (2013.01); *H02M 1/08* (2013.01); *H02M 3/155* (2013.01)

(58) Field of Classification Search
USPC ......... 327/108–112, 170, 172–175, 333, 308, 327/306, 378–383; 326/82, 83; 323/282, 323/284, 285–290
See application file for complete search history.

(56) References Cited

U.S. PATENT DOCUMENTS

| | | | | | |
|---|---|---|---|---|---|
| 5,180,938 | A | * | 1/1993 | Sin ................................. | 327/288 |
| 5,355,028 | A | * | 10/1994 | O'Toole .......................... | 326/83 |
| 5,821,783 | A | * | 10/1998 | Torimaru et al. ............. | 327/108 |
| 6,455,336 | B1 | * | 9/2002 | Berndlmaier et al. .......... | 438/14 |
| 7,106,139 | B2 | * | 9/2006 | Morimoto et al. ............ | 331/1 A |
| 7,224,187 | B2 | * | 5/2007 | Koike ............................. | 326/83 |
| 2007/0096787 | A1 | * | 5/2007 | Heightley ..................... | 327/276 |
| 2007/0252567 | A1 | * | 11/2007 | Dearn et al. .................. | 323/282 |
| 2007/0296389 | A1 | * | 12/2007 | Chen et al. ................... | 323/290 |

OTHER PUBLICATIONS

"RC Delay Calculator", Oct. 26, 2011, http://ladyada.net/library/rccalc.html.*

* cited by examiner

*Primary Examiner* — Lincoln Donovan
*Assistant Examiner* — Thomas Skibinski
(74) *Attorney, Agent, or Firm* — Duane Morris LLP (57) ABSTRACT

A driver circuit includes first switch, configured to selectively couple a first driving node to a power supply node, and a second switch, configured to selectively couple a second driving node to a ground node. The first driving node is coupled to each transistor in a first set of PMOS transistor(s) and the second driving node is coupled to each transistor in a second set of NMOS transistor(s). The driver circuit is configured to propagate a first drive signal in a first direction along an electrical path for biasing the first and second sets of transistors when the transistors in the first set, before receiving the first drive signal, are in a first state. The driver circuit is configured to propagate a second drive signal in a second direction along the path when the transistors in the first set, before receiving the second drive signal, are in a second state.

20 Claims, 7 Drawing Sheets

GATE DRIVER CIRCUIT AND METHOD

BACKGROUND

In various circuit contexts, a load (e.g., an inductor, LC tank, capacitor, speaker, or any other type of load) is driven by a voltage signal that is controlled to have either a logical HIGH (e.g., '1') or LOW (e.g., '0') voltage value. For example, a PMOS transistor and an NMOS transistor may be arranged to provide either the HIGH or LOW signal at a node coupled to the load. Such a PMOS transistor and NMOS transistor are controlled by PMOS and NMOS gate signals, respectively, to conditionally conduct current between source and drain terminals. PMOS and NMOS gate driver circuits are traditionally used to provide such gate signals, so that either the PMOS transistor is an "ON" (conducting) state and the NMOS transistor is in an "OFF" (non-conducting) state, or vice versa.

In order to prevent the PMOS and NMOS transistors from simultaneously being in the conducting state (i.e., both transistors turned on), gate drivers are traditionally designed to meet precise timing requirements. For example, a rise in a PMOS gate signal from LOW to HIGH may be designed to occur a predetermined time before a rise in an NMOS gate signal from LOW to HIGH, so that the time intervals during which the PMOS and NMOS transistors are in the conducting state do not overlap. In order to provide such a non-overlap time between one transistor being turned off and the other being turned on, separate PMOS and NMOS gate drivers have traditionally been required, which has negatively impacted cost, silicon area, power density, and power efficiency.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
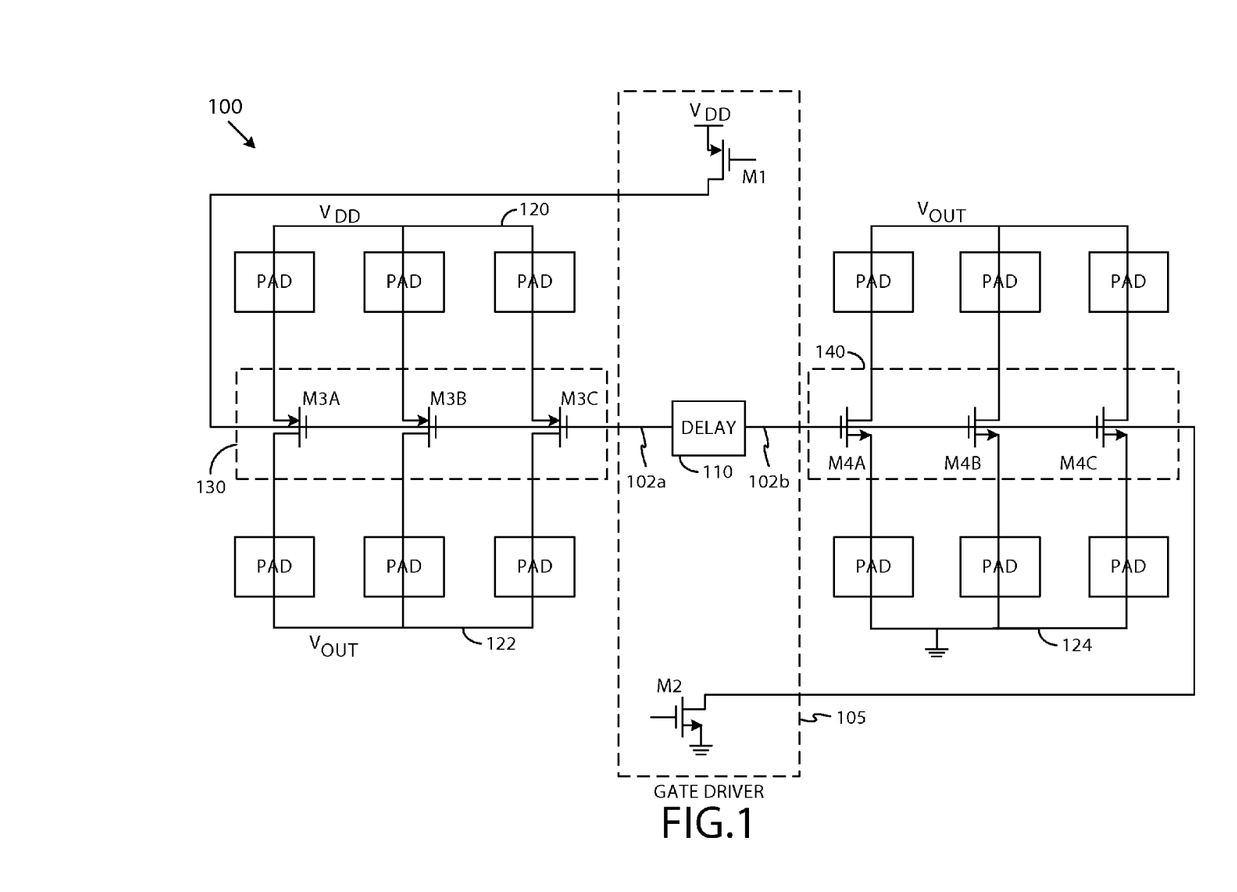
FIG. 1 is a diagram of a circuit in accordance with some embodiments of the present disclosure.

FIG. 1 is a diagram of a circuit 100 in accordance with some embodiments of the present disclosure. In FIG. 1, a gate driver circuit 105 includes switches, e.g., metal oxide semiconductor (MOS) transistors M1 and M2, configured to selectively couple nodes 102a and 102b to a positive power supply node (denoted $V_{DD}$) and a ground node, respectively. Nodes 102a and 102b may be referred to as driving nodes because transistors coupled to these nodes may be driven by a drive signal. PMOS transistor M1 and NMOS transistor M2 are controlled by applying appropriate voltages to their gates to propagate a drive signal from M1 to M2 (if M1 is turned on) or to propagate a signal from M2 to M1 (if M2 is turned on). Control circuitry (not shown) provides the gate signals to the respective gates of transistors M1 and M2.

The drive signal propagates along a serial electrical path (from M1 to M2, or from M2 to M1) for biasing the transistors M3A, M3B, and M3C (collectively "transistors M3") in a set 130 of transistors and the transistors M4A, M4B, and M4C (collectively "transistors M4") in a set 140 of transistors. Transistors M3 are pull-up devices, and transistors M4 are pull-down devices. Sets 130 and 140 are mutually exclusive, as they do not have any transistors in common. Transistors M3A, M3B, and M3C may be respective instances (sometimes referred to as "fingers") of a PMOS output device, and transistors M4A, M4B, and M4C may be respective instances of an NMOS output device. Sets 130 and 140 each have one or more transistors. FIG. 1 shows three PMOS transistors in set 130 and three NMOS transistors in set 140, but any number of transistors may be in each of the sets 130 and 140, and the two sets do not need to have the same number of transistors. The gate of each transistor in set 130 is coupled to node 102a, and the gate of each transistor in set 140 is coupled to node 102b.

Each transistor in set 130 has a source coupled to node 120, which has voltage $V_{DD}$, and a drain coupled to output node 122, which provides an output voltage $V_{OUT}$. Each transistor in set 140 has a source coupled to ground node 124 and a drain coupled to the output node 122 to provide $V_{OUT}$. Input/output (I/O) pads denoted PAD are shown in FIG. 1 for accessing voltages at various locations. For efficiency, the I/O pads may be placed directly on corresponding output devices to minimize conduction loss (e.g., by reducing resistive path length). Thus, the drain of each PMOS transistor M3 and the drain of each NMOS transistor M4 is at voltage $V_{OUT}$, such that the pads are disposed above respective locations on the node having voltage $V_{OUT}$. In some embodiments, pads are located at different locations than those shown in FIGS. 1 and 2, or pads are not present.

A delay module 110 may be disposed in the electrical path. The delay module 110 is disposed between the PMOS and NMOS transistors as shown. Thus, all the transistors of set 130 that are biased by the drive signal are disposed on one side of delay module 110 (relative to the electrical path), and all the transistors of set 140 that are biased by the drive signal are disposed on the other side of delay module 110. The delay module 110 is optional; zero or more delay modules may be used. If no delay modules are used, driving nodes 102a and 102b are simply one driving node 102.

In some embodiments, gate driver 105 is a state-aware gate driver that propagates a drive signal in one direction or in another direction based on the state of the PMOS transistors M3 and NMOS transistors M4. Suppose PMOS transistors M3 are initially in the ON state (conducting current between nodes 120 and 122, so that $V_{OUT}$ is HIGH) and NMOS transistors M4 are initially in the OFF state. A HIGH-to-LOW (falling) transition of $V_{OUT}$ is achieved as follows. PMOS transistor M1 is turned on, which propagates a first drive signal (at HIGH voltage) along node 102a in the direction towards M2. The first drive signal turns off transistors M3A, M3B, and M3C and is delayed at delay module 110 before continuing propagation along node 102b to turn on transistors M4A, M4B, and M4C. Delay module 110 (or multiple delay modules arranged serially) may be formed from one or more bidirectional buffers or passive elements such as dummy capacitors. Delay module 110 provides sufficient delay to ensure that all of the PMOS transistors M3 in set 130 are turned off before the drive signal turns on the NMOS transistors M4 in set 140. In an embodiment where no delay modules are used, circuit 100 is arranged such that the intrinsic propagation delay between transistors M3C and M4A is sufficient to ensure that all the transistors in set 130 are turned off before any of the transistors in set 140 are turned on. Such an intrinsic propagation delay can be simulated or measured to determine if it is sufficient, and if it is insufficient, one more delay modules 110 can be added as needed.

Figure 2:
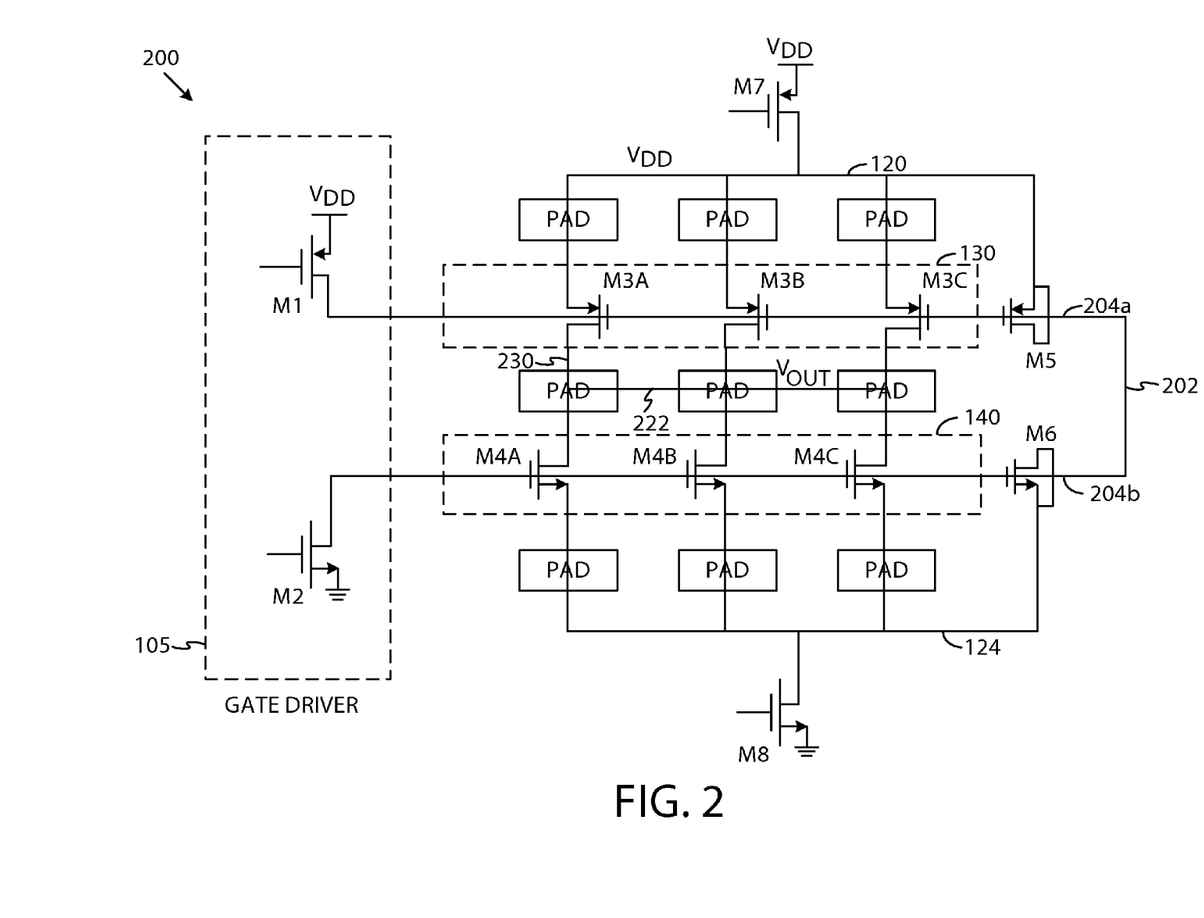
FIG. 2 is a diagram of a circuit in accordance with some embodiments having a configuration in which transistors are stacked in rows.

Suppose instead that PMOS transistors M3 are initially in the OFF state and NMOS transistors M4 are initially in the ON state, so that $V_{OUT}$ is LOW. A LOW-to-HIGH (rising) transition of $V_{OUT}$ is achieved as follows. NMOS transistor M2 is turned on, which propagates a second drive signal (at LOW voltage) along node 102b in the direction towards M1. The second drive signal turns off the transistors M4 in set 140. The second drive signal, is delayed at delay module 110 or by the intrinsic delay of the conductor that propagates the second drive signal. The second drive signal then turns on the transistors M3 in set 130 after transistors M4 are all off FIG. 2 is a diagram of a circuit 220 in accordance with some embodiments having a configuration in which transistors are stacked in rows. The switches (MOS transistors M3 and M4) are stacked for area efficiency. Driving node 202, which propagates drive signals between M1 and M2 or vice versa, includes parallel conductive portions 204a and 204b separated by a bend. In the plan view of FIG. 2, PMOS transistors M3A, M3B, and M3C are arranged in a first row, and NMOS transistors M4A, M4B, and M4C are arranged in a second row below the first row. A linear conductive portion 230 couples the drain of transistor M3A in the first row to the drain of the corresponding transistor M4A in the second row, and similar linear conductive portions are shown for other transistor pairs.

In FIG. 2, a dummy PMOS transistor M5 and a dummy NMOS transistor M6 each have source and drain terminals coupled together and provide delay for a drive signal (either a HIGH or LOW drive signal) propagating along driving node 202. Any number of dummy PMOS and/or dummy NMOS transistors may be used. In some embodiments, a stacked transistor configuration is used without any dummy transistors, e.g., because sufficient intrinsic delay to enforce turning off one set of transistors before turning on another set is provided without any dummy transistors along the electrical path. A switch (e.g., PMOS transistor M7) that is referred to as a "header" switch may be included in circuit 200 to provide the capability for a high-Z (high impedance) mode. If transistor M7 is included, that transistor has a drain coupled to node 120, and the transistor may conditionally disconnect $V_{DD}$ from the load. In some embodiments, an NMOS "footer" device M8, having a source coupled to ground and a drain coupled to node 124, may be included in conjunction with the PMOS header device to so that both power ($V_{DD}$) and ground may be disconnected from the load.

Figure 3:
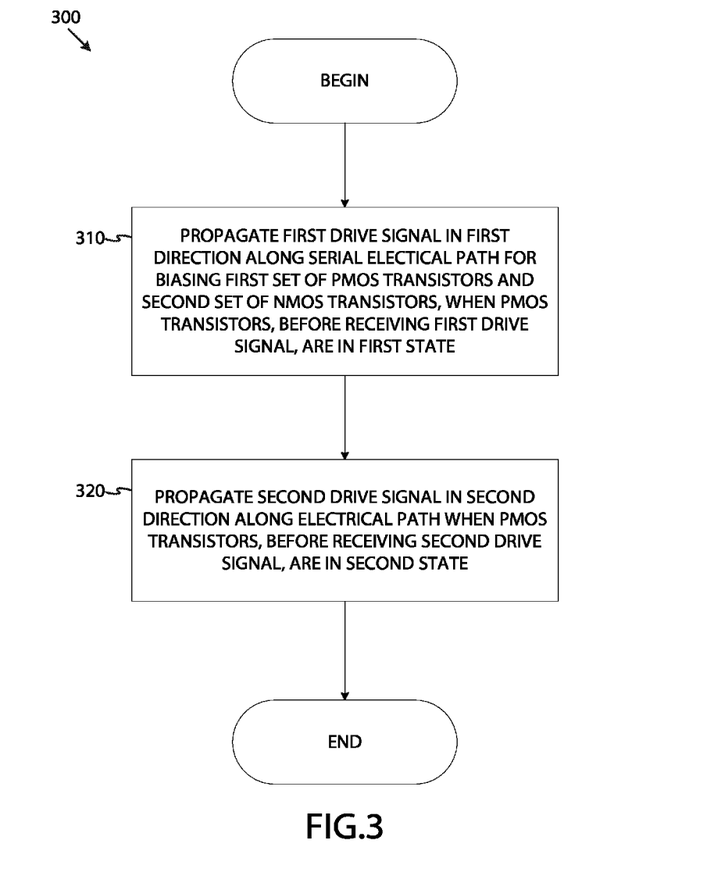
FIG. 3 is a flow diagram of a process in accordance with some embodiments.

FIG. 3 is a flow diagram of a process in accordance with some embodiments. After process 300 begins, a first drive signal is propagated (block 310) in a first direction along a serial electrical path for biasing a first set of PMOS transistors and a second set of NMOS transistors, when the PMOS transistors, before receiving the first drive signal, are in a first state. A second drive signal is propagated (block 320) in a second direction along the serial electrical path when the PMOS transistors, before receiving the second drive signal, are in a second state.

Figure 4:
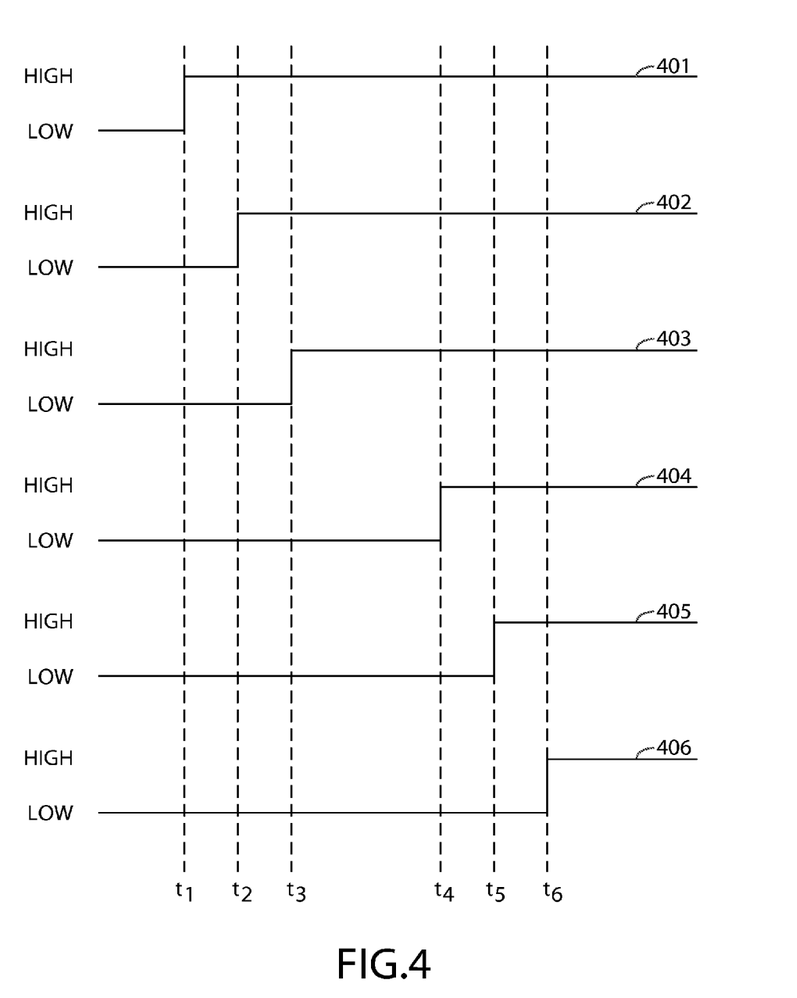
FIG. 4 is a timing diagram in accordance with some embodiments.

FIG. 4 is a timing diagram in accordance with some embodiments. Plots 401, 402, 403, 404, 405, and 406 correspond to the voltage at the gate of transistors M3A, M3B, M3C, M4A, M4B, and M4C, respectively, for a case in which PMOS transistors M3 are initially on and NMOS transistors M4 are initially off (e.g., before time $t_1$). As the propagating drive signal (having a HIGH voltage value) reaches the gate of PMOS transistors M3A, M3B, and M3C at times $t_1$, $t_2$, and $t_3$, respectively, those transistors are turned off. Then, as the drive signal reaches the gate of NMOS transistors M4A, M4B, and M4C at times $t_4$, $t_5$, and $t_6$, respectively, those transistors are turned on. Thus, rising edges of the voltages at the respective gates of transistors along the serial electrical path occur after respective propagation delays.

For the case of the opposite state transition (i.e., transistors M3 are initially off and transistors M4 are initially on), a LOW drive signal is propagated in the reverse direction as that described above, so that the voltage at the gate of transistor M4C has a falling edge, then falling edges occur at the gates of transistors M4B, M4A, M3C, M3B, and M3A sequentially.

Figure 5:
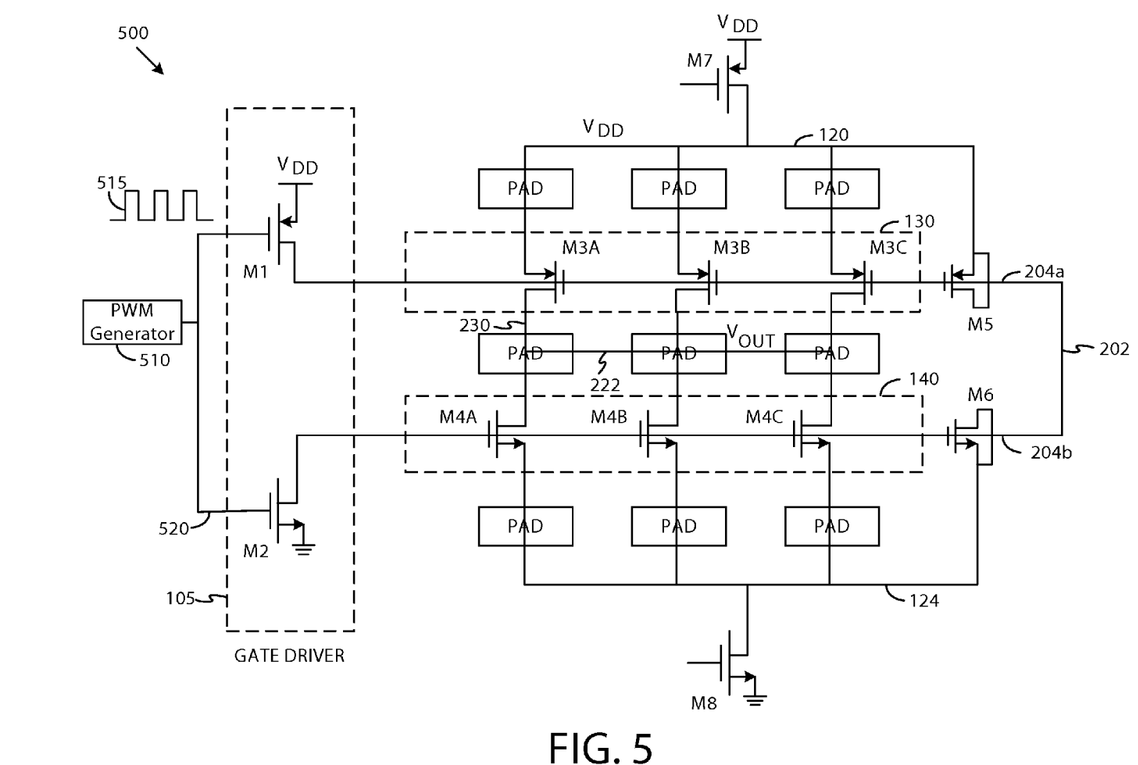
FIG. 5 is a circuit diagram showing an open loop configuration for controlling a gate driver in accordance with some embodiments.

The switches M1, M2 of the gate driver 105 may be controlled in various ways. FIG. 5 is a circuit diagram showing an open loop configuration for controlling a gate driver in accordance with some embodiments. Circuit 500 of FIG. 5 is similar in several respects to circuit 200 FIG. 2, and only differences are described for convenience. In circuit 500, gates of transistors M1 and M2 are coupled by node 520. In an open loop mode, a pulse width modulated (PWM) generator 510 outputs a periodic signal 515 at node 520. PWM signal 515 may have a fixed frequency and fixed duty cycle to control transistors M1, M2 of gate driver 105 and transistors M3, M4. In various embodiments, the PWM signal may have a frequency from, e.g., several kHz to hundreds of MHz, and the duty cycle may vary widely (e.g., about 10% to 90%).

Figure 6:
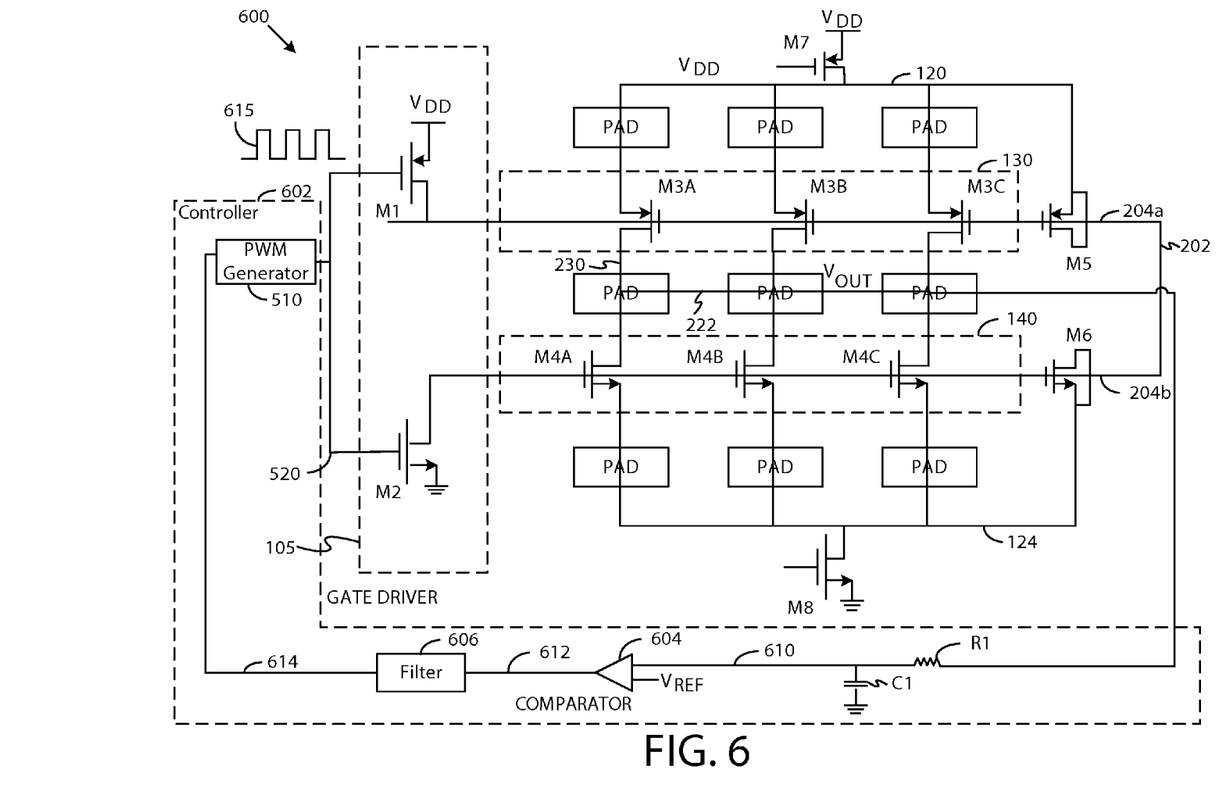
FIG. 6 is a circuit diagram in accordance with some embodiments in which a gate driver is controlled based on voltage control.

FIG. 6 is a circuit diagram in accordance with some embodiments in which a gate driver is controlled based on voltage control. In contrast to the open loop configuration shown in FIG. 5, circuit 600 of FIG. 6 includes a feedback loop from output node 222 to an input of PWM generator 510. A controller 602 controls switches M1 and M2 based on the feedback. In the voltage control mode shown in FIG. 6, output node 222 providing $V_{OUT}$ is coupled to a comparator 604, either directly or after low-pass filtering provided by resistor R1 and capacitor C1. Comparator 604 compares the signal at node 610 against a known reference or input signal $V_{REF}$. The output of the comparator at node 612 is further processed at filter 606, which may be an analog or digital filter, to change the frequency characteristics of the signal. The output of the filter at node 614 is provided as an input to PWM generator 510, which generates PWM signal 615 that contains modulation information for matching $V_{OUT}$ with the known reference signal $V_{REF}$. In a locked/steady state, the PWM generator 510 continually adjusts the duty cycle of signal 615 to match $V_{OUT}$ with $V_{REF}$. In some embodiments, an analog-to-digital converter (ADC) is used instead of comparator 604.

Figure 7:
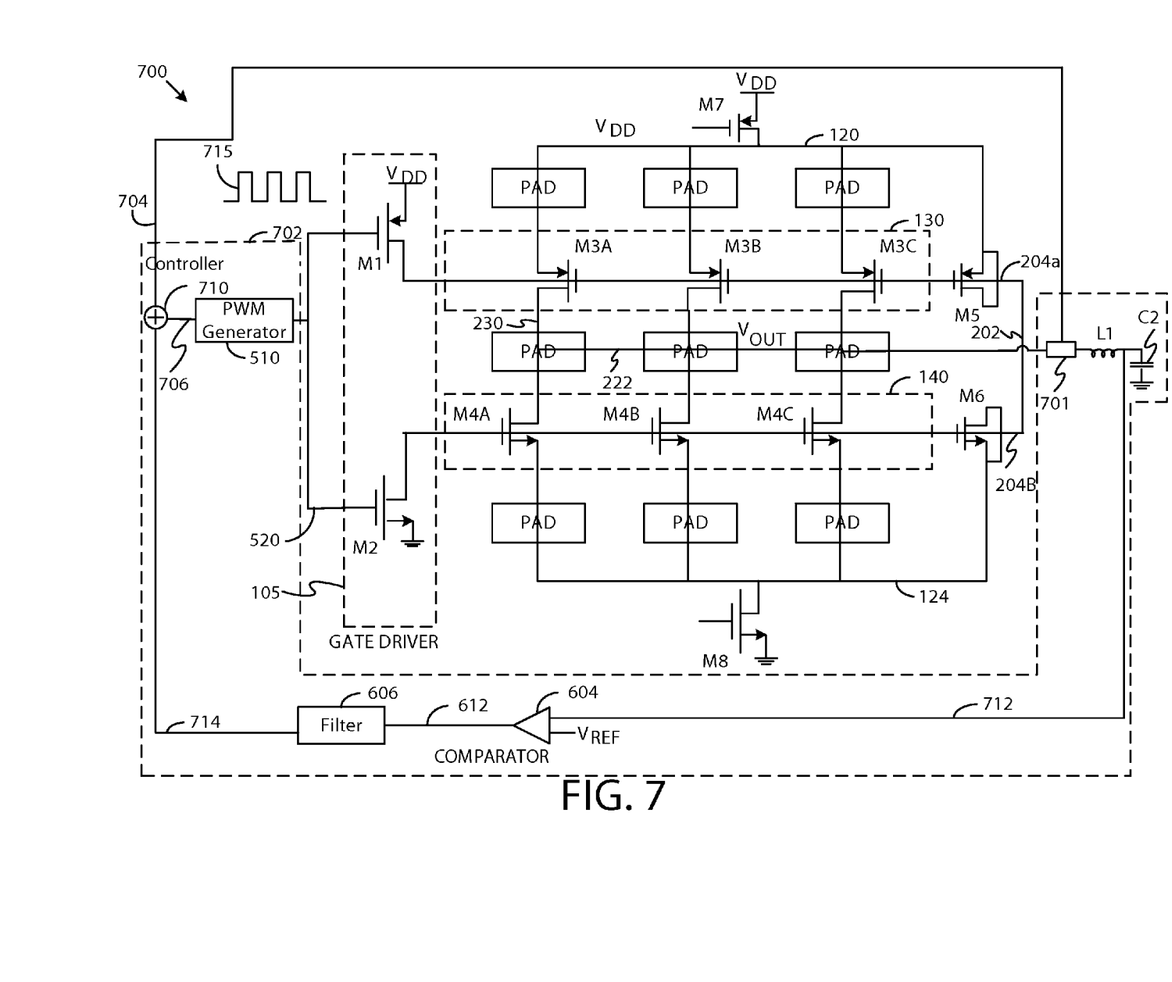
FIG. 7 is a circuit diagram in accordance with some embodiments in which a gate driver is controlled based on current control.

FIG. 7 is a circuit diagram in accordance with some embodiments in which a gate driver is controlled based on current control in a DC/DC buck converter. A current sensor 701 is coupled in series with node 222. In some embodiments, current sensor 701 is implemented as a well-characterized resistor. An inductor L1 and capacitor C2 (which may have the same capacitance or different capacitance as capacitor C1 of FIG. 6) are coupled to current sensor 701 as shown in FIG. 7. The inductor L1 and capacitor C2 form an LC tank, the output of which (at node 712) is coupled to comparator 604. Comparator 604 (or an ADC in place of the comparator) and filter 606 are the same devices as in FIG. 6. The output of the filter, at node 714, is summed at adder 710 with the current information contained in the signal obtained from the current sensor at node 704. The summed signal at node 706 is provided as input to PWM generator 510, which generates signal 715 to control the gate driver 105 and the output switches M3, M4. In a locked state, PWM generator 510 adjusts the duty cycle of signal 715 to match $V_{OUT}$ with $V_{REF}$.

The PWM generator 510 shown in FIGS. 5-7 provides one way to generate a signal which can drive the gate driver 105 and output switches. In other embodiments, pulse density modulation (PDM) is used instead of PWM. In embodiments using PDM, the pulse width of the generated signal is fixed and the frequency is varied, unlike a PWM signal which has both frequency and duty cycle (therefore also pulse width) fixed.

In some embodiments, the gate driver circuit 105 is provided off-chip, and the gate driver circuit and an output circuit including output PMOS/NMOS devices are provided on separate chips. For example, in some cases, due to the voltage limitations of the process technology, output devices are fabricated on a separate chip or silicon die.

In some embodiments, a driver circuit (e.g., gate driver circuit 105) includes a first switch (e.g., transistor M1) and a second switch (e.g., transistor M2). The first switch is configured to selectively couple a first driving node (e.g., node 102a) to a power supply node (e.g., $V_{DD}$). The second switch is configured to selectively couple a second driving node (e.g., node 102b) to a ground node. The first driving node is coupled to each transistor in a first set (e.g., set 130) of one or more PMOS transistors and the second driving node is coupled to each transistor in a second set (e.g., set 140) of one or more NMOS transistors. The driver circuit is configured to propagate a first drive signal in a first direction along a serial electrical path for biasing the first and second sets of transistors when the transistors in the first set, before receiving the first drive signal, are in a first state. The driver circuit is configured to propagate a second drive signal in a second direction along the electrical path when the transistors in the first set, before receiving the second drive signal, are in a second state.

In some embodiments, a circuit includes a first set (e.g., set 130) of one or more transistors, a second set (e.g., set 140) of one more transistors, and a driver circuit (e.g., gate driver circuit 105). The first and second sets are mutually exclusive and are disposed along a serial electrical path. The driver circuit is coupled to the first and second sets. The driver circuit is configured to propagate a first drive signal along the serial electrical path to turn off the transistors in the first set, and turn on the transistors in the second set after each transistor in the first set is turned off.

In some embodiments, a first drive signal is propagated (block 310) in a first direction along a serial electrical path for biasing a first set of PMOS transistors (e.g., set 130) and a second set of NMOS transistors (e.g., set 140), when the PMOS transistors (e.g., transistors M3), before receiving the first drive signal, are in a first state. A second drive signal is propagated (block 320) in a second direction along the serial electrical path when the PMOS transistors, before receiving the second drive signal, are in a second state.

Various embodiments ensure that PMOS and NMOS output devices may function properly without the so-called "current shoot-through" phenomenon that happens if the PMOS and NMOS devices are simultaneously in the ON state. Separate gate drivers are not needed for NMOS and PMOS devices, unlike traditional approaches. Compared to traditional techniques, various embodiments allow output devices to be operated with reduced silicon area, reduced package footprint (e.g., reduced footprint of power management integrated circuits), and reduced cost, and improved power density and power efficiency. Embodiments can be applied to various types of circuit applications, such as power converters, H-bridge drivers, power drivers, buck/boost converts, switched mode power supply (SMPS) drivers, and other applications.

Although examples are illustrated and described herein, embodiments are nevertheless not limited to the details shown, since various modifications and structural changes may be made therein by those of ordinary skill within the scope and range of equivalents of the claims.

What is claimed is:

1. A driver circuit comprising:
a first switch configured to selectively couple a first driving node to a power supply node, wherein the first driving node is coupled to each transistor in a first set of two or more PMOS transistors;
a second switch configured to selectively couple a second driving node to a ground node, wherein the second driving node is coupled to each transistor in a second set of two or more NMOS transistors;
one or more delay modules disposed between the first and second driving nodes along a serial electrical path;
an output node coupled to at least one transistor in each of the first and sets of transistors;
a current sensor coupled in series with the output node;
an inductor-capacitor (LC) tank coupled to the current sensor, the LC tank including an inductor coupled to a capacitor by a tank node;
a comparator, said comparator comparing a voltage of the tank node against a reference voltage;
a filter coupled to an output of the comparator;
an adder having first and second inputs coupled to outputs of the current sensor and filter, respectively, said adder generating an adder output as the sum of said first and second inputs; and
a pulse width modulation (PWM) generator, said PWM generator having an input coupled directly to an output of said adder, said PWM generator controlling the first and second switches,
wherein gate terminals of the respective transistors in the first set are coupled together and gate terminals of the respective transistors in the second set are coupled together,
wherein the driver circuit is configured to propagate a first drive signal in a first direction along the serial electrical path for biasing the first and second sets of transistors when the transistors in the first set, before receiving the first drive signal, are in a first state,
wherein the driver circuit is configured to propagate a second drive signal in a second direction along the serial electrical path when the transistors in the first set, before receiving the second drive signal, are in a second state, wherein the one or more delay modules include one or more dummy transistors, each dummy transistor having a source and a drain coupled to each other and to a source of each transistor in the first or second sets, the one or more dummy transistors configured to delay propagation of the first and second drive signals along the serial electrical path.

2. The driver circuit of claim 1, wherein the first driving node is the second driving node.

3. The driver circuit of claim 1, wherein the first switch is a PMOS transistor having a source coupled to the power supply node and a drain coupled to the first driving node, and the second switch is an NMOS transistor having a source coupled to the ground node and a drain coupled to the second driving node.

4. The driver circuit of claim 1, wherein the first driving node is coupled to a gate of each transistor in the first set, and the second driving node is coupled to a gate of each transistor in the second set.

5. The driver circuit of claim 1, wherein the one or more dummy transistors are configured to control delay of the propagation of the first drive signal sufficiently so that the transistors in the first set are all in the second state before the first drive signal is received at any of the transistors in the second set.

6. A circuit comprising:
 a first set of two or more transistors, wherein gate terminals of the respective transistors in the first set are coupled together;
 a second set of two or more transistors, wherein gate terminals of the respective transistors in the second set are coupled together, the first and second sets being mutually exclusive and being disposed along a serial electrical path;
 a driver circuit coupled to the first and second sets, the driver circuit configured to propagate a first drive signal along the serial electrical path to turn off the transistors in the first set, and turn on the transistors in the second set after each transistor in the first set is turned off;
 one or more delay modules disposed along the serial electrical path between a transistor of the first set and a transistor of the second set, the one or more delay modules including one or more dummy transistors, each dummy transistor having a source and a drain coupled to each other and to a source of each transistor in the first or second sets, the one or more dummy transistors configured to delay propagation of the first drive signal along the serial electrical path;
 an output node coupled at least one transistor in each of the first and sets of transistors;
 a current sensor coupled in series with the output node;
 an inductor-capacitor (LC) tank coupled to the current sensor, the LC tank including an inductor coupled to a capacitor by a tank node;
 a comparator, said comparator comparing a voltage of the tank node against a reference voltage;
 a filter coupled to an output of the comparator;
 an adder having first and second inputs coupled to outputs of the current sensor and filter, respectively, said adder generating an adder output as the sum of said first and second inputs; and
 a pulse width modulation (PWM) generator, said PWM generator having an input coupled directly to an output of said adder, said PWM generator generating a control signal.

7. The circuit of claim 6, wherein the driver circuit is further configured to propagate a second drive signal to turn off the transistors in the second set and turn on the transistors in the first set, wherein each transistor in the second set is turned off before any transistor in the first set is turned on.

8. The circuit of claim 7, wherein the driver circuit includes:
 a first switch configured to selectively provide a first logic value as the first drive signal; and
 a second switch configured to selectively provide a second logic value as the second drive signal, wherein the second logic value is a logical inversion of the first logic value.

9. The circuit of claim 8, wherein the first switch is a PMOS transistor, the first logic value is a logical high voltage value, and each transistor of the first set is a PMOS transistor.

10. The circuit of claim 8, wherein the first switch is an NMOS transistor, the first logic value is a logical low voltage value, and each transistor of the first set is an NMOS transistor.

11. The circuit of claim 8, wherein the first and second switches are controlled by the control signal.

12. The circuit of claim 6, wherein:
 each transistor in the first set includes a source coupled to a first voltage node having a first logical voltage value, and a drain coupled to an output node; and
 each transistor in the second set includes a source coupled to a second voltage node having a second logical voltage value that is a logical inversion of the first logical voltage value, and a drain coupled to the output node.

13. The circuit of claim 12, wherein the transistors of the first set are PMOS transistors, the transistors of the second set are NMOS transistors, and the first and second voltage nodes are a power supply node and a ground node, respectively.

14. The circuit of claim 12, wherein the transistors of the first set are NMOS transistors, the transistors of the second set are PMOS transistors, and the first and second voltage nodes are a ground node and a power supply node, respectively.

15. The circuit of claim 6, wherein the first and second sets of transistors are arranged in first and second rows, respectively, and at least one transistor in the first set is stacked adjacent to a corresponding transistor in the second set.

16. The circuit of claim 6, further comprising an impedance control transistor configured to selectively provide high impedance at an output node, wherein the output node is coupled to a drain of each transistor in the first and second sets.

17. The circuit of claim 6, wherein the one or more dummy transistors are configured to control delay of the propagation of the first drive signal sufficiently so that the transistors in the first set are all turned off before any of the transistors in the second set are turned on by the first drive signal.

18. A method comprising:
 propagating a first drive signal in a first direction along a serial electrical path for biasing a first set of two or more PMOS transistors and a second set of two or more NMOS transistors, when the PMOS transistors, before receiving the first drive signal, are in a first state, wherein gate terminals of the respective transistors in the first set are coupled together and gate terminals of the respective transistors in the second set are coupled together;
 propagating a second drive signal in a second direction along the electrical path when the PMOS transistors, before receiving the second drive signal, are in a second state;
 sensing, using a current sensor, a current at an output node coupled to at least one transistor in each of the first and sets of transistors; providing an inductor-capacitor LC tank coupled to the current sensor, the LC tank including an inductor coupled to a capacitor by a tank node;

comparing, at a comparator, a voltage of the tank node against a reference voltage, wherein the tank node is directly coupled to the comparator;

generating a control signal based at least in part on an output of the current sensor and a result of said comparing, wherein at least one of the drive signals is provided based on the control signal;

wherein the serial electrical path includes one or more delay modules disposed between the first and second sets of transistors, the one or more delay modules including one or more dummy transistors, each dummy transistor having a source and a drain coupled to each other and to a source of each transistor in the first or second sets, the one or more dummy transistors configured to delay propagation of the first drive signal along the serial electrical path.

19. The method of claim 18, wherein:

the first state is a conducting state, and the second state is a non-conducting state;

propagating the first drive signal along the electrical path includes propagating the first drive signal to each transistor in the first set before propagating the first drive signal to any transistor in the second set; and propagating the second drive signal along the electrical path includes propagating the second drive signal to each transistor in the second set before propagating the second drive signal to any transistor in the first set.

20. The method of claim 18, wherein the one or more dummy transistors are configured to control delay of the propagation of the first drive signal sufficiently so that the transistors in the first set are all in the second state before the first drive signal is received at any of the transistors in the second set.

* * * * *